United States Patent [19]

Stukalin et al.

[11] Patent Number: 4,842,526
[45] Date of Patent: Jun. 27, 1989

[54] TEST FIXTURE FOR ELECTRONIC COMPONENTS

[75] Inventors: Felix Stukalin, Framingham; Kristopher F. Pruyn, Bedford, both of Mass.

[73] Assignee: Digital Equipment Corporation, Maynard, Mass.

[21] Appl. No.: 151,577

[22] Filed: Feb. 2, 1988

[51] Int. Cl.⁴ .......................................... H01R 13/533
[52] U.S. Cl. ........................................................ 439/42
[58] Field of Search ................... 439/41, 42, 132, 197, 439/271, 587–588; 324/73 PC, 153 F

[56] References Cited

U.S. PATENT DOCUMENTS 4,061,969 12/1977 Dean ............................... 324/158 F
4,115,735 9/1978 Stanford ......................... 324/73 PC

FOREIGN PATENT DOCUMENTS 3226494 1/1984 Fed. Rep. of Germany ... 324/158 F

Primary Examiner—Joseph H. McGlynn
Attorney, Agent, or Firm—Kenyon & Kenyon

[57] ABSTRACT

A test fixture for facilitating connection between a pin grid array, such as those found on multi-lead electronic components, and the test leads of a diagnostic device, useful for testing such components after they are mounted on printed circuit boards. A base element is formed of transparent plastic material and carries an array of connectors, the number and arrangement of which depend upon the component to be tested. Each connector includes a test lead connector, adapted for attachment to a test lead, and a pin engagement member, adapted for making and retaining physical contact with a component pin. The pin engagement member is carried resiliently in the connector body, able to move longitudinally therein. A resilient seal means extends around the outer periphery of the underside of the base member, defining a well in the space below the base member. The seal means may include multiple resilient seal layers, separated by stiffeners. In operation, the fixture is aligned with the pin grid array protruding through the printed circuit board on the side of such board opposite the component. A vacuum system introduces subatmospheric pressure into the well, forcing the fixture against the printed circuit board and causing the connectors to make contact with the component pins.

4 Claims, 2 Drawing Sheets

TEST FIXTURE FOR ELECTRONIC COMPONENTS

BACKGROUND OF THE INVENTION

The present invention relates to the field of electronic test equipment, and mre particularly to the field of test jigs or specialized setup equipment employed in testing electronic components.

As is well-known in the field of electronic equipment manufacture, the process of correcting hidden flaws and optimizing a new design, collectively referred to as "debugging", often requires as much or more time and effort than does the original design and fabrication. This process usually requires access to electronic components mounted on printed circuit boards (PCBs) on a lead-by-lead basis, in order to test individual portions of the integrated circuits within the component. That process can be difficult, inasmuch as the components, and their multiple leads, are designed for maximum packing density, not for ease of access.

Solutions providing ready access to VLSI (very large scale integration) devices are normally very cumbersome. One approach, for example, is to solder a "pigtail" on each lead, allowing for easy attachment of test leads to any pin on the device. Clearly, however, when considering a device with up to 224 pins, the effort involved in such a method is tedious, time-consuming, expensive, and potentially hazardous to the device. Considering the number of such devices contained within an end item such as a minicomputer, wide resort to such methods simply could not succeed.

Alternatively, a clip fixture can be employed to make temporary connections to certain types of devices. A fixture is designed to make contact with the leads of a particular type of device, and the fixture physically attaches to the device, held in place by spring pressure. This method is limited to devices such as dual-in-line packages (DIPs) that are spaced from other components by a sufficient distance to allow the placement of the fixture over the device.

Another approach to this problem is the use of a "vacuum table", designed to allow connection to each pin location on a PCB. Such a device clamps onto a printed circuit board, typically by vacuum or mechanical means, and has a connection point for each pin location on the board, allowing technicians and engineers to gain access to each component on that board.

Such tools are obviously highly expensive to produce, however, as it must replicate the design of an entire PCB. Equally clearly, a new tool must be fabricated for each different (or redesigned) PCB. In addition, the great number of pin locations with which the tool must make contact necessitates a high degree of accuracy in positioning the tool relative to the PCB, generally requiring some sort of alignment means, such as locating pins or the like. Additionally, the positioning of such a large number of test probes in close proximity to the PCB introduces a high capacitance associated with such probes. With some circuit board designs, the added presence of such capacitance interferes with or prevents the proper operation of the PCB circuitry.

The net result has been that this problem has continued, with solutions being left to the improvisational talents of individual workers. That method has, of course, required the expenditure of large amounts of time and effort in attempting to arrive at a general solution. A widely-applicable technique has, however, evaded the art to date.

SUMMARY OF THE INVENTION

It is therefore an object of the present invention to provide a test fixture for multi-lead electronic components that facilitates connection between test leads and the pins or leads of the component.

A further object of the invention is provide a tool that can facilitate contact between an electronic component or components mounted on a printed circuit board and test leads from a test device.

A still further object of the invention is to provide a mechanism that will facilitate electrical connection between an electronic device on a first side of a printed circuit board and the test leads of a test device from a second side of the printed circuit board.

Yet another object of the invention is the provision of a fixture that promotes interconnection between an electronic component and a test device without requiring extensive alignment procedures.

These and other objects are achieved by the present invention, which provides a fixture for connecting test leads to a multi-pin electronic component. The invention includes a base member, generally flat in shape, having an upper surface, a lower surface, and sides surrounding and joining the surfaces. This member is preferably transparent. Resilient seal means are mounted around the periphery of the lower surface to define a well, and vacuum means introduce subatmospheric pressure within the well. Connector means are provided for making contact with the electronic component pins, and these connectors pass through the base member and extend into the well. The connectors are arranged in a pattern identical to the pattern of the electronic component pins and include pin engagement portions adapted for making the contact with the device pins and test lead connector portions adapted for making contact with the test leads.

DETAILED DESCRIPTION OF A PREFERRED EMBODIMENT

Figure 1:
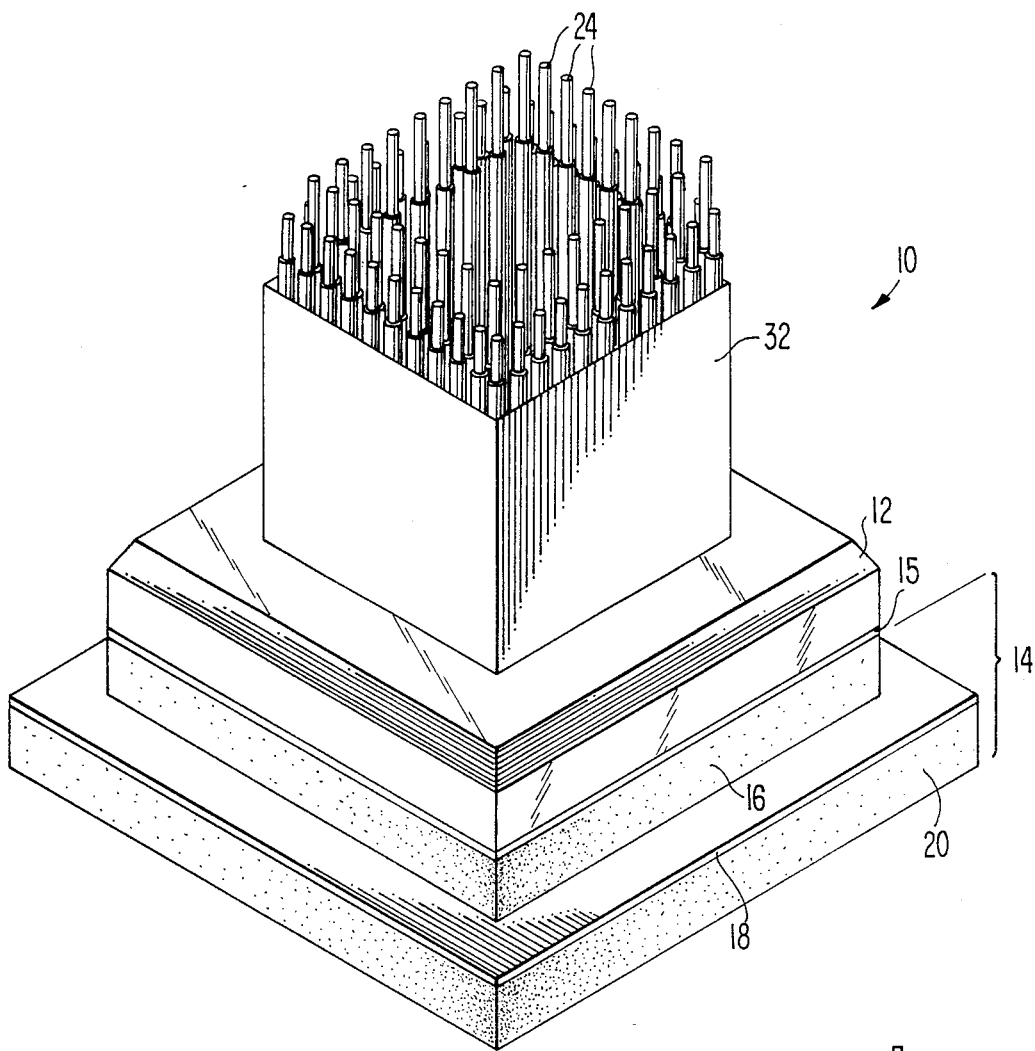
FIG. 1 is a pictorial showing a preferred embodiment of the invention.

An embodiment 10 of the invention is shown in FIGS. 1-4. As seen there, a base element 12 serves to carry the remaining elements of the fixture. The base is generally rectangular and flat. For purposes of reference, the terms "top" or "upper" will be used henceforth with respect to the surface depicted in FIGS. 1 and 3, and the terms and "bottom" or "lower" shall designate the opposite surface. As seen below, these surfaces are oriented away from and toward, respectively the device to be tested.

Preferably, the base element is chamfered at its upper surface for ease in handling. It is preferred to form the base from a high-density plastic material, and it has been found advantageous in operation if such plastic is transparent, such as clear LEXAN brand plastic or clear static dissipative polyvinylchloride material. A typical dimension for the base element is about 2 inches square. The dimensions of the base member depend on the number of test probes included, and the values mentioned herein are purely illustrative in nature. The number of probes also affects the volume of space under the base member that must be maintained in an evacuated condition.

A resilient seal assembly 14 is carried on the bottom surface of the base. This assembly is formed from a resilient material such as rubber, neoprene or the like, able to deform under load to provide a vacuum-tight seal against a surface. It has been found, however, that the operating environment of the invention (namely, the surface of a PCB) may not be perfectly flat, and that a foamed-rubber product, such as neoprene, fulfills the actual operating requirements nicely.

Although the seal assembly could be formed from a single layer of material, it has further been found that a four-layer construction provides the best combination of seal-forming ability with structural strength. As shown, the preferred assembly includes a top seal member 16 and a bottom seal member 20. The seal members may tend to deflect to the sides upon the application of pressure, rather than exerting maximum force on the area to be sealed, and therefore top and bottom stiffeners 15 and 18 are provided, positioned above the top and bottom seal members, respectively. These stiffeners are discussed in greater detail below. The seal assembly elements are bonded together, preferably with an adhesive such as ATLANTIC brand cement, available to those in the art from, for example, Greene Rubber Co., Inc., Cambridge, MA. Both seal members are formed from the foam material mentioned above, while the stiffeners should be a light, strong material such as brass, about 0.010 inch thick.

Figure 4:
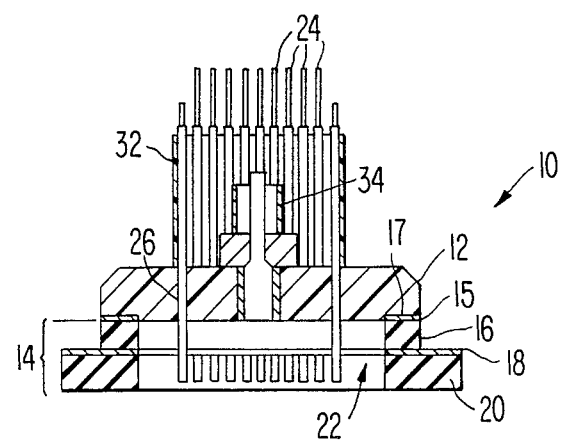
FIG. 4 is a sectional view taken on plane IV-IV of FIG. 3.

It has be found advantageous to have the outer dimensions of the top seal member and top stiffener conform to those of the base member, facilitating mounting the top seal and top stiffener on the base member. The top stiffener enhances the durability to the seal assembly and enhances the strength of the seal assembly/base member bond. The upper stiffener may be fitted into a recess 17 cut into the outer periphery of the base element lower surface, as best seen in FIG. 4. This construction allows the seal assembly to be "snap fit" onto the base member.

The bottom seal member and bottom stiffener have a slightly larger outer periphery than do the top seal member and top stiffener, so that the bottom seal member extends outwardly beyond the base member, typically extending about $\frac{1}{8}$ inch beyond the top seal. The bottom stiffener has an outer periphery equal to that of the bottom seal member, in order to distribute compressive stresses evenly across the bottom seal member. Dimensioning the bottom stiffener in this manner also minimizes sidewards deflection or "pulling in". The upper seal element is preferably about $\frac{1}{8}$ inch thick, and the bottom seal element is slightly thicker for greater sealing ability on the surface of the PCB.

The seal assembly members are formed in the shape of a hollow quadrilateral, so that when they are mounted on the base element they define a well 22 in the area directly below the base element bottom surface. Widths of the top and bottom seal elements can be about $\frac{1}{8}$ inch and $\frac{1}{4}$ inch, respectively.

Contact to the pins or leads of the device under test is made by the connectors 24. A plurality of connectors (the number depending upon the device to be tested) extends perpendicular to the base element, passing through the same and extending into the well for a distance slightly short of the well's vertical dimension. Connector passages are formed in the base element to receive the connectors, and the connectors are affixed in these passages by cement or other convenient means known to the art, such as by a press fit.

Figure 5:
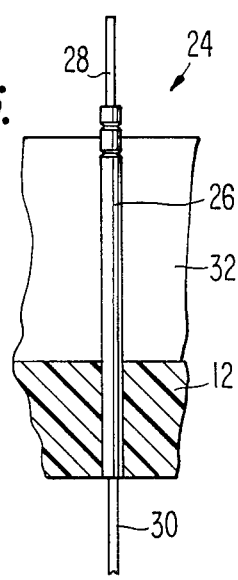
FIG. 5 is a detail sectional view of a portion of the embodiment of FIG. 1.

Although connectors could be formed from a single piece of metal, it is preferred to fabricate them as shown in FIG. 5. As shown there, a connector 24 includes a connector body 26, the lowermost portion of which extends through the base element to approximately the bottom surface thereof; a test lead connector 28 projecting upward from the top of the body; and a pin engagement member 30, protruding downward from the lower end of the body into the well. The body is hollow, with the test lead connector fixed, preferably by crimping, to its uppermost end. As the pin engagement member depends upon pressure contact with the device pins for electrical contact, that element is resiliently carried within the body. A well-known method for accomplishing this result is to insert a spring within the body, allowing the pin engagement member to move longitudinally within the body. The spring urges the pin engagement member into a fully extended position, retained within the body by a stop or other means known to the art. Such components are known to the art as "spring loaded test probes." It is preferred to employ such probes, commercially available as "Model 1600 Series" test probes from, for example, QA Technology Co., Inc., Hampton, N.H.

For optimum results, the test lead connector has a shape adapted to fit readily to a quick-fit slide element for completing a hookup with the test leads. A round cross-section is preferred. The pin engagement member has a concave shape with pointed corners to engage, make physical contact and remain in contact with the device pins. The total length of a connector may be about $1\frac{1}{2}$ inches.

The arrangement of the connectors on the base element is governed by the pin arrangement on the device to be tested. The embodiment discussed herein is adapted to test a device having a square configuration. In many instances of modern electronic design, the pins in a pin grid array are arranged very tightly, with little inter-element spacing. Such an arrangement presents a problem for connector arrangement, which is solved in the embodiment shown by arranging the connectors in a double row, forming a hollow square with two or more ranks of connectors, best seen in FIGS. 1 and 3. The connectors are arranged so that each connector will make contact with one pin in the tested device. Preferably, the lower ends of the connectors are arranged so that the distance between the base member and the lower surface of the bottom seal member is slightly greater than the distance from the base member to the ends of the connectors; in other words, the connectors are slightly recessed in the well, preferably by a distance of about 0.040 inches. This design permits the formation of a tight seal between the bottom seal member and the PCB before the connectors engage with the respective leads.

Figure 2:
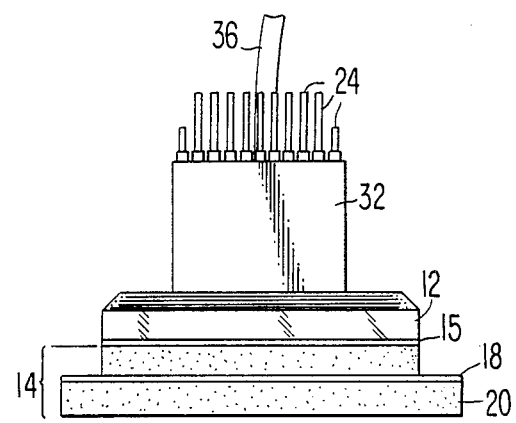
FIG. 2 is a front elevation of the embodiment depicted in FIG. 1.

Additionally, it has proved effective in making test lead connections to have the upper ends of the inner rank of connectors slightly longer than those of the outer rank, allowing the technician to distinquish readily between closely aligned connectors, as shown in FIGS. 1 and 2. In the same vein, the lower ends of outer corner connectors can be made slightly longer than surrounding connectors, allowing the unit to be aligned accurately on the device under test.

To provide stability to the array of connectors, a layer of plastic tape 32 or other structurally strengthening member may be wrapped around the outside of the connector array.

Figure 3:
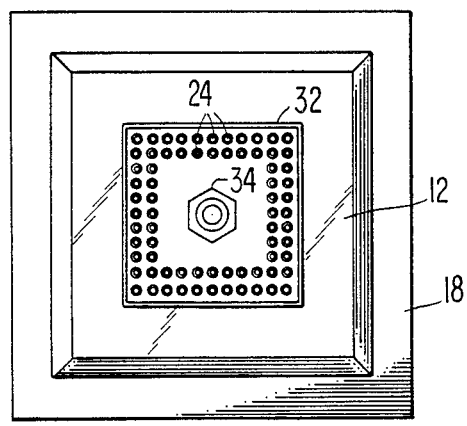
FIG. 3 is a plan view of the embodiment depicted in FIG. 1.

The retentive force for holding the embodiment in contact with a device to be tested is provided by a vacuum within the well 22, introduced through vacuum fitting 34 (Figs. 3, 4). This fitting is a standard part known to the art, attached to a vacuum pump (not shown) by a tube 36 (shown only in FIG. 2). This vacuum system may be chosen from among those systems known and available to the art. A number of test fixtures may be operated from one vacuum pump by the simple expedient of installing valves (not shown) in each vacuum line between each fixture and the pump.

Operation of the invention proceeds as follows. The device to be tested is identified on the PCB, and the PCB is turned over to locate the area where that device's leads protrude through the PCB. The fixture is then placed over these protruding leads. Alignment of the fixture with the leads is straightforward, as the transparent base element allows the technician to perform the alignment visually. With the fixture in position, the vacuum system is activated, drawing air from the well and producing subatmospheric pressure in that space. The pressure around the fixture forces it downward against the seal members, pressing the pin engagement portions of the connector members into physical contact with the device pins. As the fixture deflects downward, the pin engagement portions may move resiliently within the body portion of the connectors to maintain constant force against the pins. Once the fixture is firmly engaged with the leads of the device under test, the technician may proceed with whatever test procedure is desired. Test leads may be connected to the test lead connectors either before the engagement is accomplished or afterward. In either event, such attachment is easily made, and the arrangement can be changed rapidly for different test regimes. The fixture can be removed from the PCB rapidly simply by removing the vacuum, either by closing a valve or turning off the vacuum pump.

It will be apparent to those in the art that a wide variety of test fixtures can be fabricated according to the teaching of the present invention. For example, fixtures of radically different shape from the square embodiment discussed above may be employed in testing electronic devices of various shapes. Likewise, the makeup and arrangement of the connector members may be altered to fit particular applications. These and other changes and variations may be made without departing from the scope of the invention, which is defined solely by the claims appended hereto.

We claim:

1. A fixture for connecting test leads to a multi-pin electronic component, comprising:
    a base member, generally flat in shape, having an upper surface, a lower surface, and sides surrounding and joining said surfaces, formed from a transparent plastic material;
    resilient seal means, mounted around the periphery of said lower surface to define a well, including
    an upper stiffening member, formed of a light, strong metal, bonded to the underside of said base member;
    an upper seal member, formed of a resilient material, bonded to the underside of said upper stiffening member;
    a lower stiffening member, formed of a light, strong metal, bonded to the underside of said upper seal member;
    a lower seal member, formed of a resilient material, bonded to the underside of said lower stiffening member; and
    said upper and lower stiffening and sealing members cooperating to define said well;
    vacuum means for introducing subatmospheric pressure within said well, including a vacuum fitting carried in said base member in fluid communication with said well; and
    connector means for making contact with the electronic component pins, passing through said base member and extending into said well and being arranged in a pattern identical to the pattern of the electronic component pins and including
    a test lead connector member, adapted for attachment to the test leads;
    a body member, having a lower end extending into said base member and an upper end extending above said upper surface of said base member, said upper end carrying said test lead connector member; and
    a pin connector member, extending from said body member into said well, said pin connector member being carried resiliently in said body member for longitudinal movement therein.

2. A fixture for connecting test leads to a milti-pin electronic component, comprising:
    a base member, generally flat in shape, having an upper surface, a lower surface, and sides surrounding and joining said surfaces;
    vacuum means for introducing subatmospheric pressure within said well;
    resilient seal means, mounted around the periphery of said lower surface to define a well, including
    an upper stiffening member, formed of a light, strong metal, bonded to the underside of said base member;
    an upper seal member, formed of a resilient material, bonded to the underside of said upper stiffening member;
    a lower stiffening member, formed of a light, strong metal, bonded to the underside of said upper seal member;
    a lower seal member, formed of a resilient material, bonded to the underside of said lower stiffening member; and
    said upper and lower stiffening and sealing members cooperating to define said well; and
    connector means for making contact with electronic component pins, passing through said base member and extending into said well and being arranged in a pattern identical to the pattern of the electronic component pins and including pin engagement portions adapted for making said contact and test lead connector portions adapted for making contact with the test leads.

3. The test fixture of claim 2, wherein said upper stiffening and seal members have an outer periphery coincident with the outer periphery of said base member and said lower stiffening and seal members have coincident outer peripheries extending beyond said base member.

4. The test fixture of claim 2, wherein said upper and lower seal members are formed of a foamed resilient material.

* * * * *